United States Patent
Lin

(10) Patent No.: US 7,558,119 B2
(45) Date of Patent: Jul. 7, 2009

(54) OPERATING METHOD OF P-CHANNEL NON-VOLATILE MEMORY

(75) Inventor: Yen-Tai Lin, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 12/046,477

(22) Filed: Mar. 12, 2008

(65) Prior Publication Data
US 2008/0165587 A1 Jul. 10, 2008

Related U.S. Application Data

(62) Division of application No. 11/307,472, filed on Feb. 9, 2006.

(51) Int. Cl.
*G11C 16/06* (2006.01)
(52) U.S. Cl. .............. 365/185.18; 365/185.27; 365/185.28; 257/321
(58) Field of Classification Search ............. 365/185.27, 365/185.28, 185.18, 185.24, 185.26, 185.29; 257/321, E29.309
See application file for complete search history.

(56) References Cited

U.S. PATENT DOCUMENTS

| | | | |
|---|---|---|---|
| 6,617,637 B1 * | 9/2003 | Hsu et al. .................... 257/315 |
| 6,750,525 B2 * | 6/2004 | Yim et al. .................... 257/500 |
| 6,801,456 B1 * | 10/2004 | Hsu et al. .............. 365/185.18 |
| 6,914,826 B2 * | 7/2005 | Hung et al. ............ 365/185.28 |
| 2004/0071011 A1 * | 4/2004 | Nishizaka et al. ........... 365/154 |
| 2007/0001210 A1 * | 1/2007 | Hsu et al. .................... 257/314 |
| 2007/0008782 A1 * | 1/2007 | Sinha et al. ............ 365/185.28 |

* cited by examiner

*Primary Examiner*—Anh Phung
*Assistant Examiner*—Toan Le
(74) *Attorney, Agent, or Firm*—Jianq Chyun IP Office

(57) ABSTRACT

A P-channel non-volatile memory is described. The P-channel non-volatile memory includes a substrate, a first memory cell, and second memory cell. An N-well is disposed over the substrate, and the first cell and the second cell are disposed over the N-well. The first memory cell includes a first gate, a first charge storage structure, a first doped region and a second doped region. The first doped region and the second doped region are disposed in the substrate on the respective sides of the first gate. The second cell includes a second gate, a second charge storage structure, a third doped region, and the second doped region. The third doped region and the second doped region are disposed in the substrate on the respective sides of the second gate. The second cell and the first cell share the second doped region.

7 Claims, 2 Drawing Sheets

OPERATING METHOD OF P-CHANNEL NON-VOLATILE MEMORY

CROSS-REFERENCE TO RELATED APPLICATION

This application is a divisional of an application Ser. No. 11/307,472, filed on Feb. 9, 2006, now pending. The entirety of the above-mentioned patent application is hereby incorporated by reference herein and made a part of this specification.

BACKGROUND OF THE INVENTION

1. Field of the Invention

The present invention relates to a memory and operating method thereof. More particularly, the present invention relates to a P-channel non-volatile memory and operating method thereof.

2. Description of the Related Art

Electrically erasable programmable read-only-memory (EEPROM) is a type of non-volatile memory that allows multiple data entry, reading and erasing operations. The stored data will be retained even after power to the device is removed. Moreover, the access speed is fast, the storage capacity per unit weight is large and the access device occupies only a small volume. With these advantages, EEPROM has become one of the most widely adopted non-volatile memories for personal computer and electronic equipment.

A typical EEPROM has a floating gate and a control gate fabricated using doped polysilicon. To prevent a conventional EEPROM from over-erasing in an erasing operation and leading to the registering of erroneous data, an additional select gate fabricated using doped polysilicon is disposed on the sidewall of the control gate and the floating gate above the substrate. In other words, a select transistor is set up on one side beside the sidewalls of the control gate and the floating gate.

In the conventional technique, a charge trapping layer is sometimes used to replace the polysilicon floating gate. The charge trapping layer is fabricated using silicon nitride, for example. In general, the silicon nitride layer is sandwiched between an upper and a lower silicon oxide layer to form an oxide-nitride-oxide (ONO) composite layer. This type of device is often referred to as a silicon/silicon oxide/silicon nitride/silicon oxide/silicon (SONOS) device.

However, most SONOS memory devices are N-channel non-volatile memories. The N-channel non-volatile memory has small channel current and poor energy utilization. There is only 1 electron injection for the passage of a total of between $10^8 \sim 10^{10}$ electrons. Therefore, in a low energy consumption portable electronic product area, the applications of an N-channel non-volatile memory is rather restricted. If the memory cell further incorporates a select transistor, the dimension of the device will increase and accordingly limit the development of a higher level of integration for the devices.

SUMMARY OF THE INVENTION

Accordingly, at least one objective of the present invention is to provide a P-channel non-volatile memory and operating method thereof, wherein the P-channel non-volatile memory consumes lower power, has higher operating speed and higher storage capacity.

At least another objective of the present invention is to provide a P-channel non-volatile memory, wherein an additional select transistor is not required for preventing over-erasing problem.

To achieve these and other advantages and in accordance with the purpose of the invention, as embodied and broadly described herein, the invention provides a P-channel non-volatile memory. The P-channel non-volatile memory includes a substrate, a first memory cell and a second memory cell. An N-well is disposed over the substrate, and the first cell and the second cell are disposed over the N-well. The first memory cell includes a first gate, a first charge storage structure, a first doped region and a second doped region. The first gate is disposed over the substrate. The first charge storage structure is disposed between the first gate and the substrate. The first doped region and the second doped region are disposed in the substrate on the respective sides of the first gate. The second cell includes a second gate, a second charge storage structure, a third doped region, and the second doped region. The second gate is disposed over the substrate. The second charge storage structure is disposed between the second gate and the substrate. The third doped region and the second doped region are disposed in the substrate on the respective sides of the second gate. The second cell and the first cell share the second doped region.

According to an embodiment of the present invention, the first charge storage structure and the second charge storage structure include silicon nitride, for example.

According to an embodiment of the present invention, the P-channel non-volatile memory further includes a first tunneling dielectric layer disposed between the first charge storage structure and the substrate and a second tunneling dielectric layer disposed between the second charge storage structure and the substrate.

According to an embodiment of the present invention, the first tunneling dielectric layer and the second tunneling dielectric layer include silicon oxide, for example.

According to an embodiment of the present invention, the memory further includes a first barrier dielectric layer disposed between the first gate and the first charge storage structure.

According to an embodiment of the present invention, the memory further includes a second barrier dielectric layer disposed between the second gate and the second charge storage structure.

According to an embodiment of the present invention, the first doped region is coupled to a bit line and the third doped region is coupled to another bit line.

According to an embodiment of the present invention, the first gate is coupled to a word line and the second gate is coupled to another word line.

The foregoing P-channel non-volatile memory has a low operating voltage, a low power rating, and a fast operating speed. In addition, there is no need for installing a MOS transistor, which has no storage capacity, to serve as a select transistor. Thus, the dimension of each memory cell can be substantially reduced and the level of device integration can be significantly increased.

The present invention also provides a method of operating a P-channel non-volatile memory. The P-channel non-volatile memory includes a substrate, an N-well disposed in the substrate and a pair of serially connected first memory cell and a second memory cell above the N-well. The second doped region is shared by the first memory cell and the second memory cell. Each memory cell includes a gate disposed over the substrate, a charge storage structure disposed between the substrate and the gate and a first doped region and a third doped region disposed on the respective side of the gate in the substrate. The operation method includes the following steps.

For programming the first memory cell of the P-channel non-volatile memory, a first voltage is applied to the first doped region of the first memory cell; a second voltage is applied to the gate of the first memory cell; a third voltage is applied to the gate of the second memory cell, the channel underneath the second memory cell is turned on; a fourth voltage is applied to the third doped region of the second memory cell; and a fifth voltage is applied to the N-well. The fourth voltage is higher than the first voltage and the fourth voltage is higher than the second voltage so that the channel hot holes can induce a hot electron injection effect to program the first memory cell.

For programming the second memory cell of the P-channel non-volatile memory, the fourth voltage is applied to the first doped region of the first memory cell; the third voltage is applied to the gate of the first memory cell, the channel underneath the first memory cell is turned on; the second voltage is applied to the gate of the second memory cell; the first voltage is applied to the third doped region of the second memory cell; and the fifth voltage is applied to the N-well. Hence, channel hot holes can induce the hot electron injection mechanism to program the second memory cell.

For erasing the data from the first memory cell of the P-channel non-volatile memory, a sixth voltage is applied to the gate of the first memory cell; and a seventh voltage is applied to the N-well. The seventh voltage is higher than the sixth voltage so that the F-N tunneling effect can be triggered to erase the first memory cell.

For erasing the data from the second memory cell of the P-channel non-volatile memory, an eighth voltage is applied to the gate of the second memory cell; and the seventh voltage is applied to the N-well. The seventh voltage is higher than the eighth voltage so that the F-N tunneling effect can be triggered to erase the second memory cell.

According to an embodiment of the present invention, furthermore, a ninth voltage may be applied to the first doped region of the first memory cell or the first doped region of the first memory cell is maintained at a floating state; and a tenth voltage is applied to the third doped region of the second memory cell or the third doped region of the second memory cell is maintained at a floating sate.

For reading data from the first memory cell of the P-channel non-volatile memory, an eleventh voltage is applied to the first doped region of the first memory cell; a twelfth voltage is applied to the gate of the first memory cell; a thirteenth voltage is applied to the gate of the second memory cell; a fourteenth voltage is applied to the third doped region of the second memory; and a fifteenth voltage is applied to the N-well. The fourteenth voltage is higher than the eleventh voltage, for example.

For reading data from the second memory cell of the P-channel non-volatile memory, the fourteenth voltage is applied to the first doped region of the first memory cell; the thirteenth voltage is applied to the gate of the first memory cell; the twelfth voltage is applied to the gate of the second memory cell; the eleventh voltage is applied to the third doped region of the second memory; and the fifteenth voltage is applied to the N-well.

According to an embodiment of the present invention, every pair of serially connected neighboring memory cells forms a memory unit. When one of the memory cells is being operated, the other memory cell serves as a select transistor for controlling the switching of the underlying channel to prevent the operating memory cell from having program disturbance problem. Furthermore, the programming operation is carried out using the channel hot hole induced hot electron mechanism and the erasing action is carried out through the F-N tunneling effect. As a result, the operating efficiency of the P-channel non-volatile memory is enhanced.

The P-channel non-volatile memory has the advantages of a lower operating voltage, a low power rating and a fast writing speed. Furthermore, program disturbance problem can be prevented without requiring any additional select transistor. In addition, the single polysilicon structure can combine with the system-on-chip (SOC) technique in the CMOS fabrication process as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
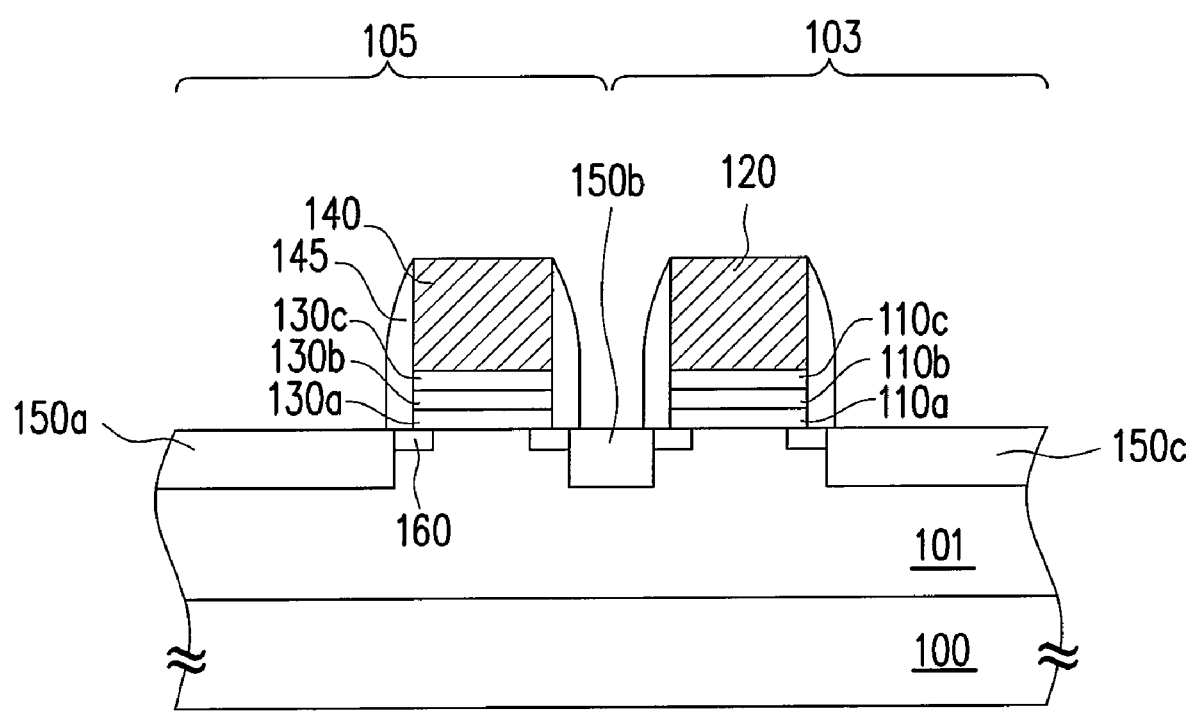
FIG. 1 is a schematic cross-sectional view of a P-channel non-volatile memory according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a P-channel non-volatile memory according to one embodiment of the present invention. As shown in FIG. 1, the P-channel non-volatile memory includes a substrate 100, a well 101, a first memory cell 103 and a second memory cell 105, for example. The substrate 100 is a P-type substrate, for example. The well 101 is an N-well disposed in the substrate, for example. The first memory cell 103 and the second memory cell 105 are disposed over the well 101 and are serially connected together, for example.

The first memory cell 103 includes a tunneling dielectric layer 110a, a charge storage structure 110b, a barrier dielectric layer 110c, a gate 120, a doped region 105b and a doped region 150c. The tunneling dielectric layer 110a, the charge storage structure 110b, the barrier dielectric layer 110c and the gate 120 are disposed, from bottom to top, are stacked in sequence over the substrate 100. The doped region 150b and the doped region 150c are disposed in the substrate 100 on the respective side of the gate 120, for example.

The tunneling dielectric layer 110a and the barrier dielectric layer 110c are fabricated using silicon oxide, for example. The charge storage structure 110b includes a material capable of trapping electric charges including, for example, silicon nitride, silicon oxynitride, tantalum oxide, strontium titanate or hafnium oxide. The gate 120 includes a conductive material including, for example, doped polysilicon, metal or metal oxide. The doped regions 150b and 150c are P-doped regions containing P-type dopants such as boron.

It should be noted that the foregoing barrier dielectric layer 110c could be selectively disposed according to the device design. In one embodiment, only the tunneling dielectric layer 110a and the charge storage structure 110b are disposed between the gate 120 and the substrate 100.

The second memory cell 105 includes a tunneling dielectric layer 130a, a charge storage structure 130b, a barrier dielectric layer 130c, a gate 140, a doped region 150a and the doped region 150b. The tunneling dielectric layer 130a, the charge storage structure 130b, the barrier dielectric layer 130c and the gate 140, from bottom to top, are stacked in sequence over the substrate 100. The doped region 150a and the doped region 150b are disposed in the substrate 100 on the respective sides of the gate 140, for example. The second memory cell 105 and the first memory cell 103 share the same doped region 150b and are serially connected together.

The tunneling dielectric layer 130a, the charge storage structure 130b, the barrier dielectric layer 130c and the gate 140 include the same material as the aforementioned tunneling dielectric layer 110a, the charge storage structure 110b, the barrier dielectric layer 110c and the gate 120, for example. Similarly, the barrier dielectric layer 130c can be selectively disposed according to the actual requirements.

Spacers 145 are disposed on the respective sidewalls of the gates 120 and 140, for example. The spacers are fabricated using silicon oxide, for example. The substrate 100 underneath the spacers 145 has a doped region 160 disposed therein for minimizing the short channel effect.

In one embodiment, the doped region 150a is coupled to a bit line and the doped region 150c is coupled to another bit line, for example. The gate 140 of the second memory cell 105 is coupled to a word line and the gate 120 of the first memory cell 103 is coupled to another word line, for example. The operation of the P-channel non-volatile memory includes treating the serially connected first memory cell 103 and second memory cell 105 as a single memory unit. In the process of writing data into the first memory cell 103, the second memory cell 105 serves as a select transistor. When writing data into the second memory cell 105, the first memory cell 103 serves as a select transistor. In this way, problems such as erroneous judgment of data or program disturbance can be avoided during writing, reading or erasing operation.

It should be noted that the P-channel non-volatile memory in the present embodiment has a P-type substrate 100 and an N-type well 101. Obviously, the memory in the present invention is a P-channel non-volatile memory without an N-type well but have an N-type substrate.

The advantages of the aforementioned P-channel non-volatile memory are a low operating voltage, a low power rating and a fast operating speed. In addition, the serially connected first memory cell 103 and second memory cell 105 constitutes a memory unit. Thus, to program data into or read data from one of the memory cells, the other memory cell can serve as a select transistor. In other words, no additional MOS transistor without storage capability is required to serve as a select transistor. Because of this arrangement, the dimension of each memory cell can be significantly reduced leading to a higher level of device integration.

Furthermore, the P-channel non-volatile memory of the present invention has a single-layered polysilicon structure. Therefore, the memory in the system-on-chip (SOC) can be easily integrated with the CMOS logic fabrication process.

Figure 2A:
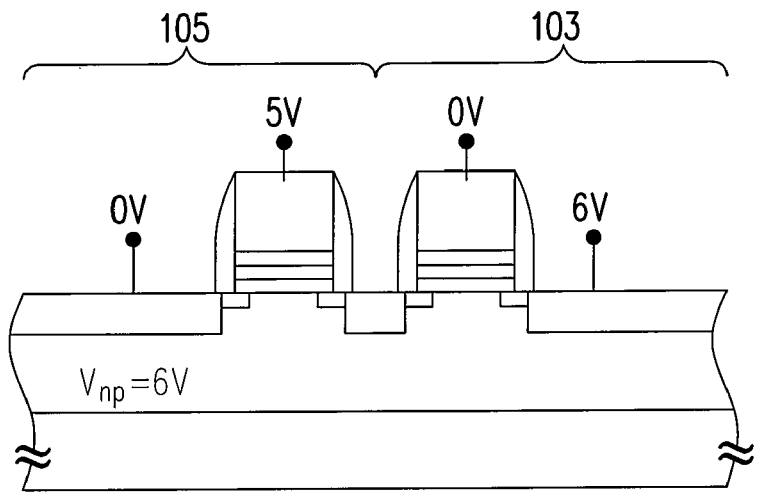
FIG. 2A is a schematic cross-sectional view showing the programming mode of a P-channel non-volatile memory according to one embodiment of the present invention.
Figure 2B:
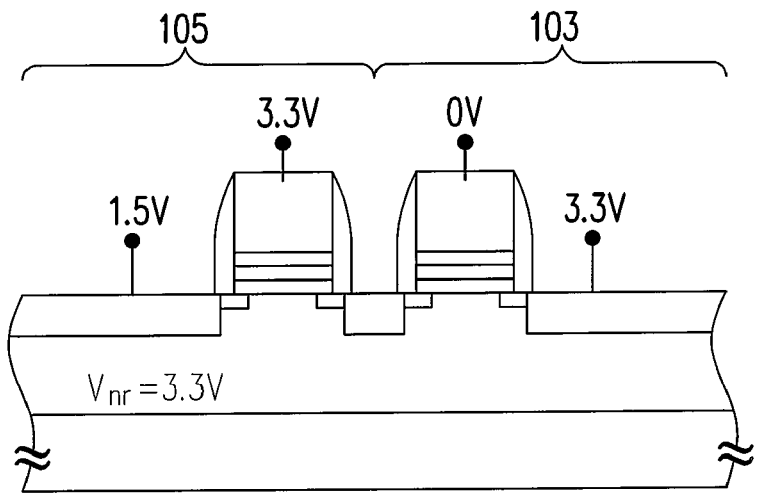
FIG. 2B is a schematic cross-sectional view showing the reading mode of a P-channel non-volatile memory according to one embodiment of the present invention.
Figure 2C:
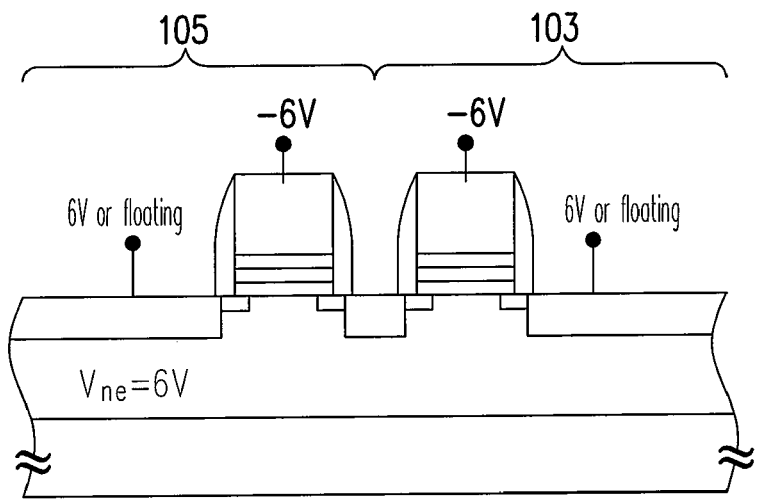
FIG. 2C is a schematic cross-sectional view showing the erasing mode of a P-channel non-volatile memory according to one embodiment of the present invention.

In the following, the method of operating the N-channel non-volatile memory is described. FIG. 2A is a schematic cross-sectional view showing the programming mode of a P-channel non-volatile memory according to one embodiment of the present invention. FIG. 2B is a schematic cross-sectional view showing the reading mode of a P-channel non-volatile memory according to one embodiment of the present invention. FIG. 2C is a schematic cross-sectional view showing the erasing mode of a P-channel non-volatile memory according to one embodiment of the present invention.

In the present invention, the operation of the P-channel non-volatile memory is illustrated using two serially connected memory cells 103 and 105 as an example. While writing data into the second memory cell 105, the first memory cell 103 serves as a select transistor. On the other hand, while writing data into the first memory cell 103, the second memory cell 105 serves as a select transistor. In this way, problems such as erroneous judgment of data or program disturbance can be avoided during the operation of the P-channel non-volatile memory.

As shown in FIG. 2A, for programming data into the second memory cell 105 of the memory unit, a voltage $V_{sp}$ of about 0V is applied to the first doped region of the second memory cell 105, a voltage $V_{gp}$ of about 5V is applied to the gate of the second memory cell 105, a voltage $V_{g'p}$ of about 0V is applied to the gate of the first memory cell 103, a voltage $V_{dp}$ of about 6V is applied to the third doped region of the first memory cell 103, and a voltage $V_{np}$ of about 6V is applied to the N-well. The first memory cell 103 serves as a select transistor. The application of a voltage $V_{g'p}$ to the gate of the first memory cell 103 turns on the channel underneath the first memory cell 103. The voltage $V_{dp}$ of the first memory cell 103 is higher than the voltage $V_{sp}$ of the second memory cell 105 and the voltage $V_{dp}$ of the first memory cell 103 is higher than the gate voltage $V_{gp}$ of the second memory cell 105. As a result, channel hot holes can induce the hot electron injection effect to program data into the second memory cell 105.

To program the first memory cell 103 of the memory unit, the voltage $V_{sp}$ originally applied to the first doped region of the second memory cell 105 for programming the second memory cell 105 is applied to the third doped region of the first memory cell 103. The voltage $V_{gp}$ originally applied to the gate of the second memory cell 105 is applied to the gate of the first memory cell 103. The voltage $V_{dp}$ originally applied to the third doped region of the first memory cell 103 is applied to the first doped region of the second memory cell 105. The voltage $V_{g'p}$ originally applied to the gate of the first memory cell 103 is applied to the gate of the second memory cell 105. In doing so, the channel underneath the second memory cell 105 is turned on. Furthermore, the voltage difference between the first doped region of the second memory cell 105 and the third doped region of the first memory cell 103, the gate of the first memory cell 103 is used to trigger channel hot hole induced hot electron injection effect. Thus, data is programmed into the first memory cell 103.

As shown in FIG. 2B, for reading data from the second memory cell 105, a voltage $V_{sr}$ of about 1.5V is applied to the first doped region of the second memory cell 105, a voltage $V_{gr}$ of about 3.3V is applied to the gate of the second memory cell 105, a voltage $V_{g'r}$ of about 0V is applied to the gate of the first memory cell 103, a voltage $V_{dr}$ of about 3.3V is applied to the third doped region of the first memory cell 103, and a voltage $V_{nr}$ of about 3.3V is applied to the N-well. The first memory cell 103 serves as a select transistor to turn on the channel underneath the first memory cell 103 when the voltage $V_{g'r}$ is applied to the gate of the first memory cell 103. The gate voltage $V_{gr}$ of the second memory cell 105, the drain voltage $V_{dr}$ of the first memory cell 103 and the voltage $V_{nr}$ of the N-well are identical. Furthermore, the drain voltage $V_{dr}$ of the first memory cell 103 is higher than the source voltage $V_{sr}$ of the second memory cell 105. Therefore, by detecting/measuring the on-off state/current density of the channel underneath the second memory cell 105, the data stored inside the second memory cell 105 can be judged ('1' or '0').

To read data from the first memory cell 103, the voltage $V_{sr}$ originally applied to the first doped region of the second memory cell 105 for reading data from the second memory cell 105 is applied to the third doped region of the first memory cell 103. The voltage $V_{gr}$ originally applied to the gate of the second memory cell 105 is applied to the gate of the first memory cell 103. The voltage $V_{dr}$ originally applied to the third doped region of the first memory cell 103 is applied to the first doped region of the second memory cell 105. The voltage $V_{g'r}$ originally applied to the gate of the first memory cell 103 is applied to the gate of the second memory cell 105. Thus, the channel underneath the second memory cell 105 is turned on. Therefore, by determining/measuring the on-off state/current density of the channel underneath the first memory cell 103, the data stored inside the first memory cell 103 can be judged ('1' or '0').

As shown in FIG. 2C, for erasing data from the memory cells 105, 103 of the memory unit, the first doped region of the second memory cell 105 is floated or a voltage $V_{se}$ of about 6V is applied to the first doped region of the second memory cell 105, a voltage $V_{ge}$ of about −6V is applied to the gate of the second memory cell 105, a voltage $V_{g'e}$ of about −6V is applied to the gate of the first memory cell 103; the third doped region of the first memory cell is floated or a voltage $V_{de}$ of about 6V is applied to the third doped region of the first memory cell 103, and a voltage $V_{ne}$ of about 6V is applied to the N-well. The voltage $V_{ne}$ in the N-well or the voltage of $V_{se}$, $V_{de}$ is higher than the gate voltage $V_{ge}$ of the second memory cell 105 and the gate voltage $V_{g'e}$ of the first memory cell 103. Using the voltage difference between the N-well or cell's channel and the gate of memory cells 105, 103, F-N tunneling effect is established in the tunneling oxide of the memory cells 105 and 103. Hence, electrons are pulled out from the respective memory cells 105, 103 for erasing the data stored within the memory cells 105 and 103.

In the present embodiment, a P-channel non-volatile memory having a P-type substrate and an N-well is used in the description. However, the present invention can also be applied to a P-channel non-volatile memory without an N-well but having an N-type substrate. Obviously, if this type of N-type substrate memory is used, the voltage originally applied to the N-well will have to be applied to the N-type substrate.

In aforementioned method of operating the P-channel non-volatile memory, every pair of serially connected neighboring memory cells forms a memory unit. When one of the memory cells is being operated on, the other memory cell serves as a select transistor for controlling the switching of the underlying channel to overcome the program disturbance problem. Furthermore, the programming operation is carried out using the channel hot hole induced hot electron mechanism and the erasing action is carried out through the F-N tunneling effect. As a result, the operating efficiency of the P-channel non-volatile memory is enhanced.

In summary, the P-channel non-volatile memory of the present invention uses two serially connected memory cells as a memory unit so that one of the memory cells can serve as a select transistor when the other memory cell is operated. Since there is no need to fabricate a select transistor, the size of each memory cell can be reduced and thereby further increase the level of integration.

The P-channel non-volatile memory has the advantages of a lower operating voltage, a lower power rating and a fast writing speed. Therefore, it finds many applications in portable electronic devices. Furthermore, the programming operation is carried out using the channel hot hole induced hot electron mechanism and the erasing action is carried out through the F-N tunneling effect. As a result, the operating efficiency of the P-channel non-volatile memory is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of operating a P-channel non-volatile memory, the P-channel non-volatile memory comprising a substrate, an N-well disposed in the substrate and a serially connected first memory cell and second memory cell disposed over the N-well, such that a second doped region is share by the first memory cell and the second memory cell, and each memory cell comprising a gate disposed over the substrate, a charge storage structure disposed between the substrate and the gate, and a first doped region and a third doped region disposed in the substrate on respective sides of the gate; the operating method comprising:

performing a programming operation to the first memory cell of the P-channel non-volatile memory by applying a first voltage to the first doped region of the first memory cell, applying a second voltage to the gate of the first memory cell, applying a third voltage to the gate of the second memory cell, opening up the channel underneath the second memory cell, applying a fourth voltage to the third doped region of the second memory cell, and applying a fifth voltage to the N-well, wherein the fourth voltage is higher than the first voltage, and the fourth voltage is higher than the second voltage so that a channel hot hole induced hot electron injection effect is triggered to program the first memory cell.

2. The operating method of claim 1, wherein the method further comprises:

performing a programming operation to the second memory cell of the P-channel non-volatile memory by applying the fourth voltage to the first doped region of the first memory cell, applying the third voltage to the gate of the first memory cell, opening up the channel underneath the first memory cell, applying the second voltage to the gate of the second memory cell, applying the first voltage to the third doped region of the second memory cell, and applying the fifth voltage to the N-well so that the channel hot hole induced hot electron injection mechanism is triggered to program the second memory cell.

3. The operating method of claim 1, wherein the method further comprises:

performing a erasing operation to the P-channel non-volatile memory by applying a sixth voltage to the gate of the first memory cell and applying a seventh voltage to the N-well, wherein the seventh voltage is sufficiently higher than the sixth voltage to trigger F-N tunneling to erase the first memory cell.

4. The operating method of claim 3, wherein the method further comprises:

performing a erasing operation to the P-channel non-volatile memory by applying an eighth voltage to the gate of the second memory cell and applying the seventh voltage to the N-well, wherein the seventh voltage is sufficiently higher than the eighth voltage to trigger F-N tunneling to erase the second memory cell.

5. The operating method of claim 4, wherein the method further comprises:
applying a ninth voltage to the first doped region of the first memory cell or floating the first doped region of the first memory cell, and applying a tenth voltage to the third doped region of the second memory cell or floating the third doped region of the second memory cell.

6. The operating method of claim 1, wherein the method further comprises:
performing a reading operation to the first memory cell of the P-channel non-volatile memory by applying an eleventh voltage to the first doped region of the first memory cell, applying a twelfth voltage to the gate of the first memory cell, applying a thirteenth voltage to the gate of the second memory cell, applying a fourteenth voltage to the third doped region of the second memory cell, and applying a fifteenth voltage to the N-well, wherein the fourteenth voltage is higher than the eleventh voltage.

7. The operating method of claim 6, wherein the method further comprises:
performing a reading operation to the second memory cell of the P-channel non-volatile memory by applying the fourteenth voltage to the first doped region of the first memory cell, applying the thirteenth voltage to the gate of the first memory cell, applying the twelfth voltage to the gate of the second memory cell, applying the eleventh voltage to the third doped region of the second memory cell, and applying the fifteenth voltage to the N-well.

* * * * *